United States Patent [19]
Tanaka et al.

[11] Patent Number: 5,293,301
[45] Date of Patent: Mar. 8, 1994

[54] SEMICONDUCTOR DEVICE AND LEAD FRAME USED THEREIN

[75] Inventors: Masato Tanaka, Nakano; Katsuya Fukase, Nagano; Mitsuharu Shimizu, Nagano; Toshiyuki Murakami, Nagano, all of Japan

[73] Assignee: Shinko Electric Industries Co., Ltd., Nagano, Japan

[21] Appl. No.: 798,736

[22] Filed: Nov. 27, 1991

[30] Foreign Application Priority Data

Nov. 30, 1990 [JP] Japan ................ 2-340496
Nov. 30, 1990 [JP] Japan ................ 2-340500
Nov. 30, 1990 [JP] Japan ................ 2-340501

[51] Int. Cl.$^5$ ................................ H05K 7/20
[52] U.S. Cl. ................................ 361/707
[58] Field of Search ............ 165/80.3, 185; 174/16.3, 52.4; 357/81, 70, 74; 361/383, 386–389, 398, 421

[56] References Cited

U.S. PATENT DOCUMENTS

| | | | |
|---|---|---|---|
| 4,689,110 | 8/1987 | Leibowitz | 361/388 |
| 4,700,273 | 10/1987 | Kaufman | 361/388 |
| 5,055,914 | 10/1991 | Shimizu et al. | 361/389 |
| 5,065,281 | 11/1991 | Hernandez et al. | 361/421 |

FOREIGN PATENT DOCUMENTS

| | | | |
|---|---|---|---|
| 0025612 | 3/1981 | European Pat. Off. | 357/81 C |
| 0002077 | 1/1978 | Japan | 357/81 C |
| 58-12341 | 1/1983 | Japan | 361/386 |

OTHER PUBLICATIONS

Patent Abstracts of Japan, vol. 015, No. 280, Jul. 16, 1991 for 03 095 959.
Patent Abstracts of Japan, vol. 014, No. 455, Sep. 28, 1990 for 02 181 956.
Patent Abstracts of Japan, vol. 006, No. 234, Nov. 20, 1982 for 57 136 352.
Patent Abstracts of Japan, vol. 015, No. 046, Feb. 4, 1991 for 02 278 753.
Patent Abstracts of Japan, vol. 015, No. 098, Mar. 8, 1991 for 02 306 639.
Patent Abstracts of Japan, vol. 010, No. 370, Dec. 10, 1986 for 61 166 051.

Primary Examiner—Gregory D. Thompson
Attorney, Agent, or Firm—Michael N. Meller

[57] ABSTRACT

A lead frame to be used for a semiconductor device, comprising: a heat sink having a peripheral area and a central projected land on which a semiconductor chip is to be mounted. The heat sink has a relatively good heat radiating characteristic. A plurality of inner leads are provided, each having an inner end superimposed on the peripheral area of the heat sink by an insulating material. A semiconductor chip has a chip surface on which a junction pattern is arranged, and is mounted on the projected land of the heat sink by an insulating adhesive so that the chip surface faces the projected land. TAB leads are provided for electrically connecting the semiconductor chip to the inner leads, and a sealing resin hermetically seals at least the semiconductor chip.

4 Claims, 7 Drawing Sheets

SEMICONDUCTOR DEVICE AND LEAD FRAME USED THEREIN

BACKGROUND OF THE INVENTION

1. Field of the Invention

This invention relates to a semiconductor device and a lead frame used therein, and more particularly, to a semiconductor device having improved heat radiation characteristics.

2. Description of the Related Art

A semiconductor-device having a good heat radiating characteristic is conventionally known, and such a known semiconductor device comprises a semiconductor chip rigidly mounted on a heat sink, so that the heat derived from the semiconductor chip can be discharged via the heat sink and dispersed to the leads or the sealing resin.

Another conventionally known semiconductor device has a lead frame which comprises two layers, one being a dia-pad having a relatively wide area, so that the heat derived from the semiconductor chip can be discharged via the die-pad.

Nevertheless, recently semiconductor chips are required to be more and more sophisticated and complicated, and this the mount of heat derived from the semiconductor chip has increased. Therefore, it should be noted that a conventional semiconductor device as mentioned above does not have the required heat radiating characteristics.

SUMMARY OF THE INVENTION

An object of the present invention is to provide a semiconductor device and a lead frame used therein and capable of improving the heat radiation characteristic thereof.

Another object of the present invention is to provide a semiconductor device and a lead frame used therein and capable of overcoming the drawbacks in the prior art, as mentioned above.

According to one aspect of the present invention, there is provided a semiconductor device comprising: a lead frame comprising a heat sink having a peripheral area and a central projected land, said heat sink having a relatively good heat radiating characteristic, and a plurality of inner leads, each having an inner and superimposed on said peripheral area of the heat sink by an electrically insulating material; a semiconductor chip having a chip surface on which a junction pattern is arranged, said semiconductor chip being mounted on said central projected land of the heat sink by an electrically insulating adhesive so that said chip surface faces said projected land; TAB leads for electrically connecting said semiconductor chip to said inner leads; and a sealing resin hermetically sealing at least said semiconductor chip.

According to another aspect of the present invention, there is provided a lead frame to be used for a semiconductor device, said lead frame comprising: a heat sink having a peripheral area and a central projected land on which a semiconductor-chip is mounted, said heat sink having a relatively good heat radiating characteristic; and a plurality of inner leads, each having an inner end superimposed on said peripheral area of the heat sink by an electrically insulating material.

According to still another aspect of the present invention, there is provided a semiconductor device comprising: a semiconductor chip having a chip surface on which a junction pattern is arranged; a heat sink made of any suitable material having a coefficient of thermal expansion similar to that of said semiconductor chip, said heat sink being attached to said chip surface of the semiconductor chip by a chip-coated layer; and a sealing resin hermetically sealing at least said semiconductor chip to make a hermetic package.

According to further aspect of the present invention, there is provided a structure for mounting a semiconductor device comprising: a ceramic board made of a material having a coefficient of thermal expansion, a circuit pattern having terminals formed on said ceramic board; said ceramic board being provided integrally with a projected land portion on which a semiconductor chip is to be mounted; a semiconductor chip having a chip surface on which a junction pattern is arranged, said semiconductor chip being mounted on said projected land portion by an electrically insulating adhesivse so that said chip surface faces said projected land; means for electrically connecting said semiconductor chip to said terminals of the circuit pattern on the ceramic board; and a cap means rigidly secured to said ceramic board for enclosing and hermetically sealing said semiconductor chip.

According to a still further aspect of the present invention, there is provided a structure for mounting a semiconductor device comprising: a ceramic board made of a material having a coefficient of thermal expansion, said ceramic board having one surface provided integrally with a projected land portion on which a semiconductor chip is to be mounted, and holes penetrating said one surface to the other surface thereof; a semiconductor chip having a chip surface on which a junction pattern is arranged, said semiconductor chip being mounted on said projected land portion by an electrically insulating adhesive so that said chip surface faces said projected land; a cap means rigidly secured to said ceramic board for enclosing and hermetically sealing said semiconductor chip; and wires extending from said semiconductor chip through said holes, to be introduced to the other side of the ceramic board.

DESCRIPTION OF THE PREFERRED EMBODIMENTS

Figure 1:
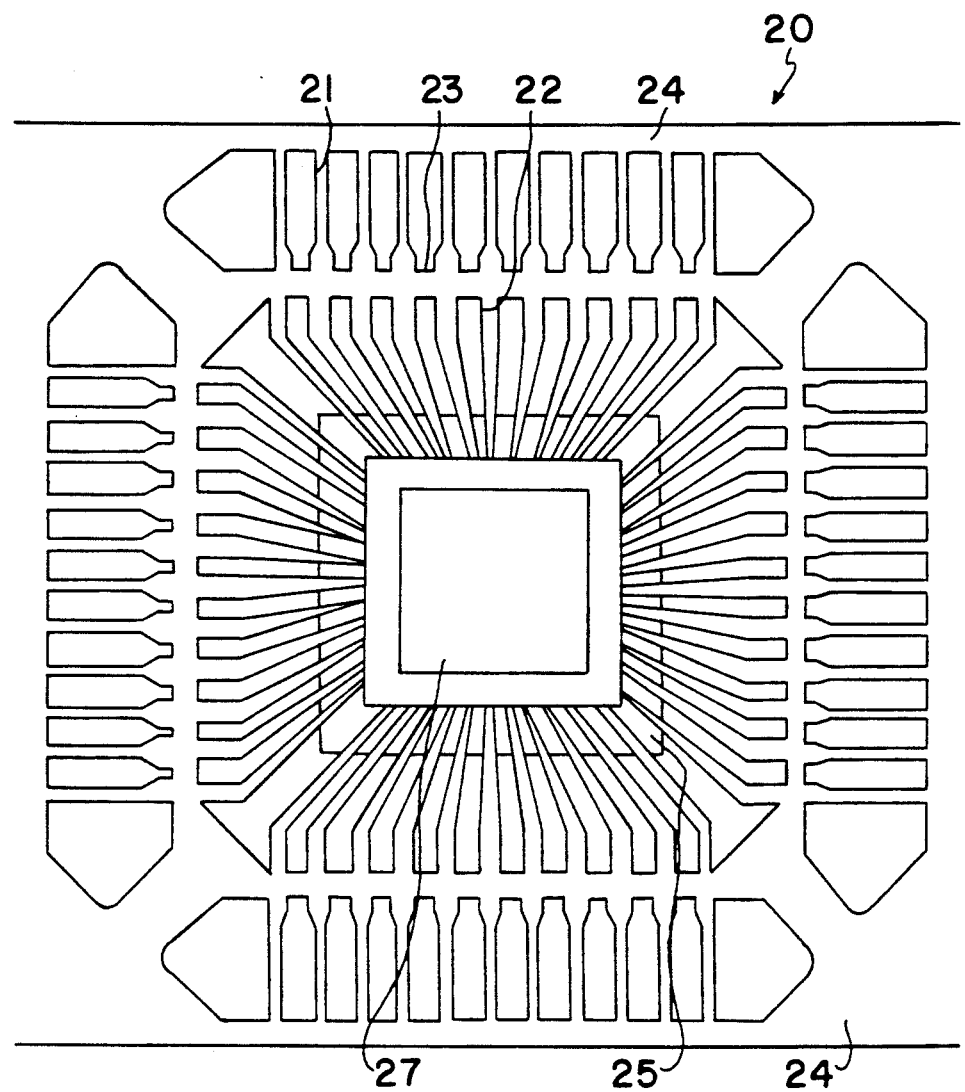
FIG. 1 is a plan view of a lead frame according to the present invention.
Figure 2:
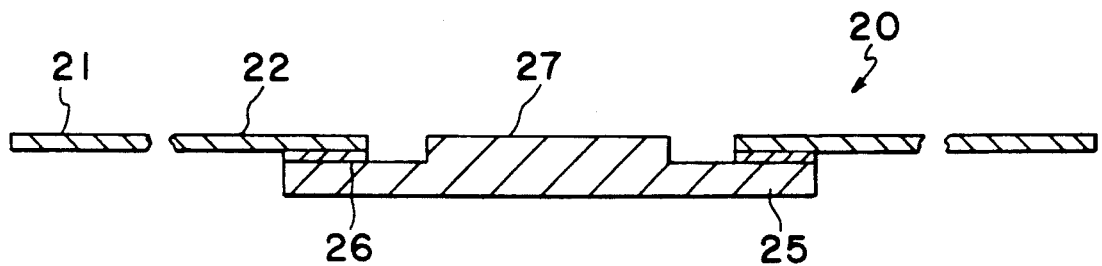
FIG. 2 is a cross-sectional view of the lead frame shown in FIG. 1.

Referring now to the drawings, wherein FIG. 1 is a plan view of a lead frame according to the present invention and FIG. 2 is a cross-sectional view of the lead frame shown in FIG. 1, the lead frame 20 includes outer leads 21, inner leads 22, dam bars 23, rails 24, and a heat sink 25.

The upper periphery of the heat sink 25 is attached, via an electrically insulative adhesive 26, to the lower surfaces of the inner leads 22. The upper surface of the heat sink 25 is provided, at an area surrounded by the tips of the inner leads 22, with an upper projected land 27 at substantially the same level as the upper surfaces of the inner leads 22.

The heat sink 25 can be made of any suitable metal or ceramic having relatively good heat radiating characteristics. For example, it is advantageous to use Mo, AlN, SiC, or Cu-W, which have substantially the same coefficient of heat expansion as that of the semiconductor chip to be mounted on the heat sink 25.

Figure 3:
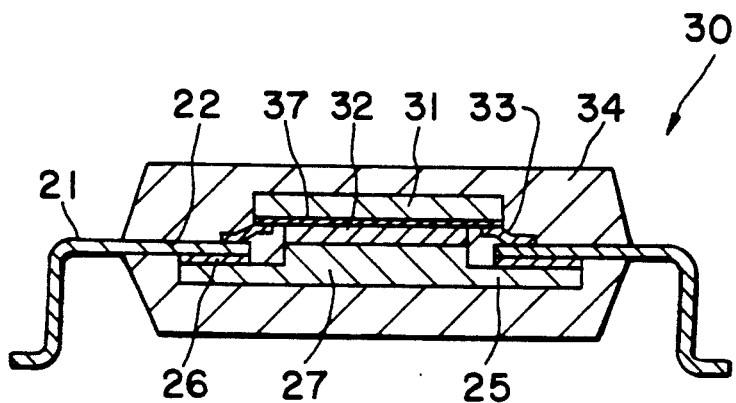
FIG. 3 is a cross-sectional view of an embodiment of a semiconductor device according to the present invention.

FIG. 3 is a cross-sectional view of an embodiment of a semiconductor device 30 according to the present invention in which the above-mentioned lead frame 20 is used. The semiconductor device 30 comprises the heat sink 25 provided with the upper projected land 27, on which mounted is a semiconductor chip 31 via the insulative adhesive layer 32. This semiconductor chip 31 is arranged so that a surface thereof having a junction pattern 37 faces the projected land 27. The semiconductor chip 31 is electrically connected to the inner leads 22 via TAB (Tape Automated Bonding) leads 33. The heat sink 25 is hermetically sealed with a sealing resin 34, to thus complete this semiconductor device.

The TAB leads comprise many electrical conductive leads made of, for example, copper foil or layers formed on an insulative carrier, usually called a TAB tape. The TAB leads 33 are first electrically connected to the semiconductor chip at one end thereof and electrically connected to the inner leads at the other end thereof, respectively.

Figure 4:
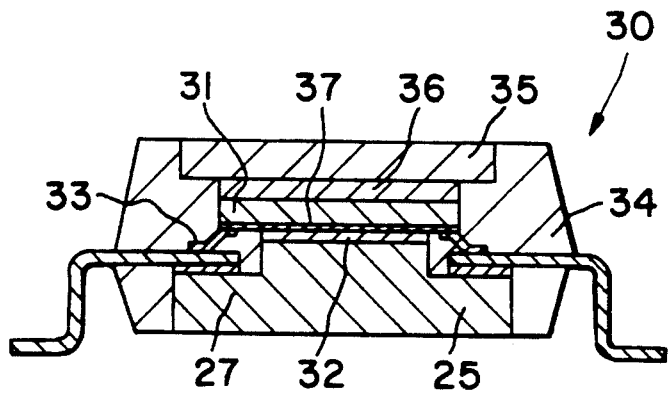
FIG. 4 is a cross-sectional view of another embodiment of a semiconductor device of this invention.

FIG. 4 is a cross-sectional view of another embodiment of a semiconductor device of this invention. In this embodiment, the semiconductor chip 31 is also provided at the opposite side thereof with another heat sink 35, via an adhesive 36. The semiconductor chip 31 and the both heat sinks 25 and 35 are hermetically sealed with a resin so that the lower and upper surfaces of the heat sinks 25 and 35 are exposed to the atmosphere. Note, the both heat sinks 25 and 35 may be completely sealed with a resin, or only a part of these heat sinks 25 and 35 ma be exposed to the atmosphere.

As the semiconductor device of this invention is constructed as mentioned above, the heat derived from the surface of the semiconductor chip, on which the junction pattern 37 is arranged and from which a relatively large amount of heat is radiated, is directly discharged via the heat sink 25. Therefore, the semiconductor device of this invention has a good heat radiating cahracteristic and may be constituted as a highly sophisticated device. In the embodiment shown in FIG. 4, in which the heat sink 35 is also provided at the other side of the semiconductor chip, the heat radiating characteristic can be further improved.

Further, since the lead frame 20 is provided with the heat sink 25, the upper surface thereof being provided with the upper projected land 27, the semiconductor chip can be easily secured thereto. Also, since the TAB leads 33 are used, the semiconductor chip 31 may be easily connected to the inner leads 22, even though the semiconductor chip 31 is mounted so that the surface thereof, on which the electrodes are arranged, faces the projected land 27.

Figure 5:
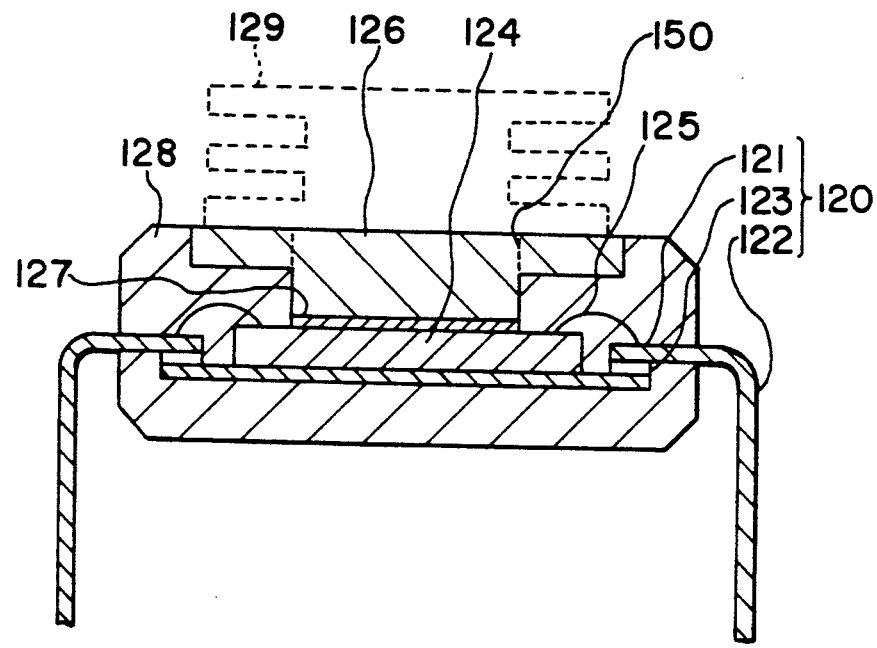
FIG. 5 is a cross-sectional view of still another embodiment of a semiconductor device of this invention.

FIG. 5 is a cross-sectional view of a dual-layer type resin sealed semiconductor device of this invention. The semiconductor device comprises inner leads 121, outer leads 122, and a die-pad 123. The die-pad 123 is relatively large so that the periphery thereof overlaps with the inner leads 121 to improve the heat radiation characteristics and secured to the inner leads 121 via an insulative adhesive.

A semiconductor chip 124 is rigidly mounted on the die-pad 123 via, for example, an Au-Si eutectic alloy, and the semiconductor chip 124 is electrically connected to the inner leads 121 by bonding wires 125. The die-pad 123 also may be used to function as a ground plane. In this case, the die-pad 123 has a terminal connected to one of the inner leads, i.e., a ground line.

To reduce the thermal stress between the semiconductor chip 124 and the die-pad 123, the lead frame 120, or at least the die-pad 123 of the lead frame 120, is advantageously made of a material having a coefficient of thermal expansion close to that of the semiconductor chip 124, for example, a 42 alloy (Fe-Ni alloy). In this embodiment, the heat sink 126 is rigidly secured to the surface of the semiconductor chip 124, on which a junction pattern is arranged, via a chip coated layer 127 made of an insulative resin, for example, polyimide.

The heat sink 126 is advantageously made of a material having a coefficient of thermal expansion close to that of the semiconducter chip 124, for example, Mo, Aln, Sic, Cu-W or the like.

Further, preferably the heat sink 126 is wider than the semiconductor chip 124, to ensure a sufficient radiation surface. In this case, however, the heat sink 126 must be provided with side recesses to maintain escape spaces which prevent the bonding wires 125 from interfering with the heat sink 126. Therefore, in this case, the wires 125 must be first connected to the semiconductor chip 124 by a wire-bonding process, and then the heat sink 126 fixedly secured to the chip surface of the semiconductor chip 124.

As shown by a broken line 150 in FIG. 5, if the heat sink 126 has a size and shape such that it does not interfere with the bonding-wires, it is possible to effect the wire-bonding operation after the semiconductor chip 124 is rigidly secured to the heat sink 126.

The semiconductor chip 124, the die-pad 123, the inner leads 121, the wires 125, and the heat sink 126 are hermetically sealed with a sealing resin 128. In this case, the heat sink 126 may be completely sealed with the sealing resin 128. To further more increase the heat radiation characteristic, however, the heat sink 126 may be sealed with the sealing resin 128 so that the upper surface of the heat sink 126 is exposed at the same level as the outer surface of the sealing resin 128.

Furthermore, to obtain an increased heat radiation characteristic, preferably a heat radiation fin 129 is attached to the heat sink 126, as shown by a broken line 129 in FIG. 5.

In the embodiment mentioned above, the heat derived from the surface of the semiconductor chip 124 can be discharged from the lower surface of the semiconductor chip via the dia-pad 123 and the leads, in the same manner as a semiconductor device known in the prior art. Further, according to the present invention, the heat also can be discharged from the chip surface of the semiconductor chip 124, on which a junction pattern is arranged, and therefore, a large amount of heat is radiated and can be discharged directly via the heat sink 126. Therefore, the semiconductor device of this invention has a good heat radiating characteristic and may be constituted as a highly sophisticated device.

The coefficient of heat expansion of the sealing resin 128 is generally high, and therefore, it is difficult to match this with the coefficient of heat expansion of the semiconductor chip 124. In this embodiment, however, since the heat sink 126 and the die-pad 123 are arranged as a sandwich-like structure on the upper and lower sides of the semiconductor chip 124, respectively, the structure of the semiconductor chip 124 is well balanced with respect to the upper and lower direction. Therefore, the sealing resin 128 is not deformed or bent due to a heat shrinkage, and therefore, it is possible to produce a large size semiconductor chip.

Figure 6:
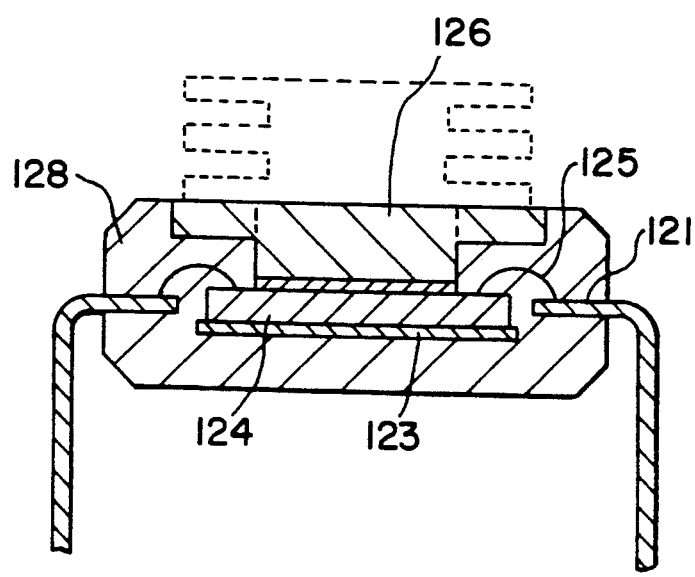
FIG. 6 is a cross-sectional view of another embodiment similar to that shown in FIG. 4.

FIG. 6 is a cross-sectional view of an embodiment of a single layer lead frame. In this embodiment, the die-pad 123 has a small size and is separated from the inner leads 121. Nevertheless, one of the surfaces of the semiconductor chip 124, from which a relatively large amount of heat is radiated, is attached to a heat sink 126, and therefore, the heat radiating characteristics can be improved. Also, in the same manner as the above embodiment, the heat sink 126 and the die-pad 123 are arranged on the upper and lower sides of the semiconductor chip 124, respectively, and the package is not deformed or bent due to heat shrinkage.

Figure 7:
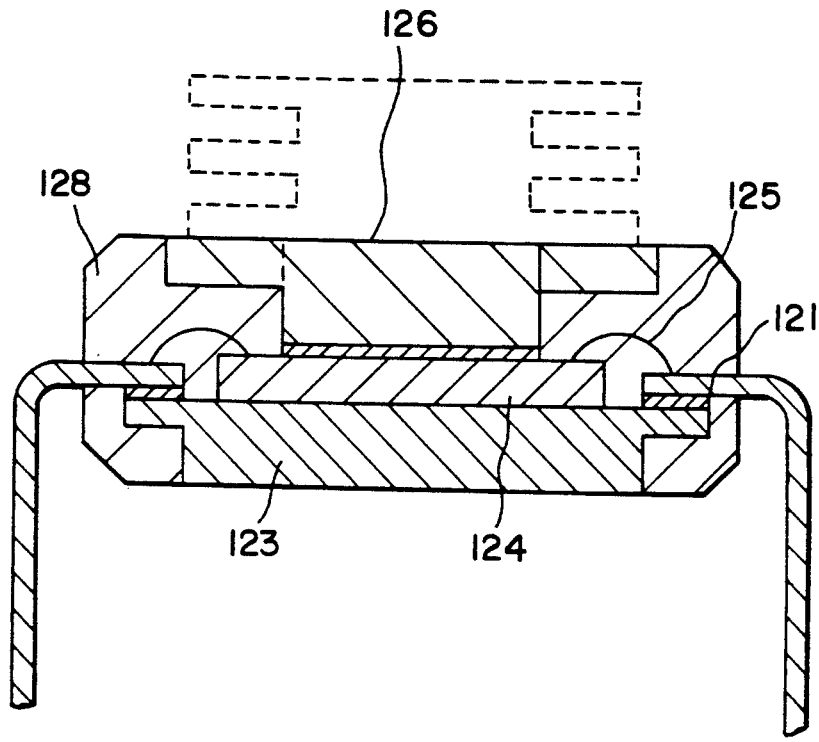
FIG. 7 is a cross-sectional view of still further embodiment similar to that shown in FIG. 4.

FIG. 7 is a cross-sectional view of an embodiment in which a semiconductor chip 124 is Mounted on a die-pad 123 which also functions as a heat sink, and thus the heat radiating characteristic is improved and the package is not deformed or bent due to heat shrinkage.

In the embodiments as mentioned above with reference to FIGS. 5, 6 and 7, although the semiconductor chip 124 and the inner leads 121 are connected to each other by bonding wires 125, TAR (Tape Automated Bonding) leads also can be used for the same purpose.

Figure 8:
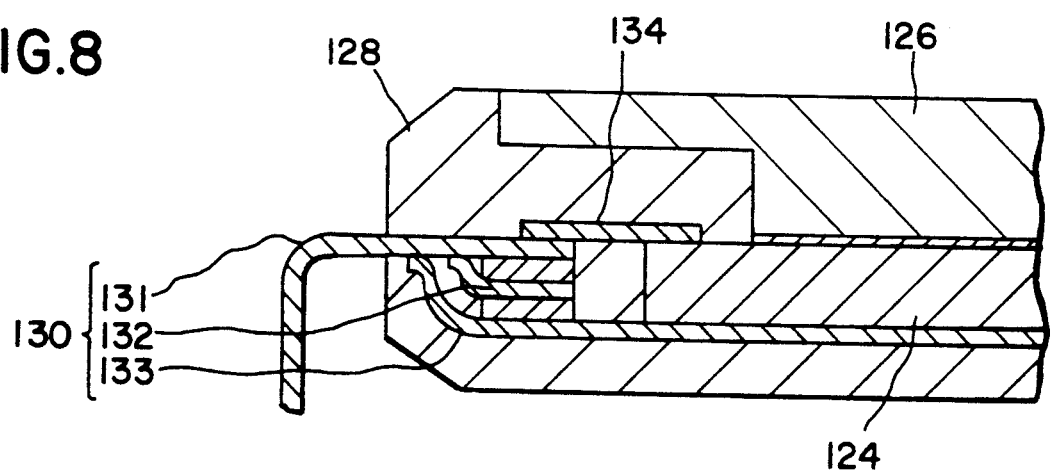
FIG. 8 is a partial cross-sectional view of a further embodiment of this invention.

FIG. 8 is a partial cross-sectional view of an embodiment in which a multi-layer lead frame 130 and TAB leads 134 are used. In this embodiment, the multi-layer lead frame 130 comprises three layers, i.e., a lead frame 131 (signal layer), a power supply plane 132 and a ground plane 133, laminated to each other by insulative sheets. The power supply plane 132 and the ground plane 133 have terminals respectively connected to a power supply line and a ground line in the lead frame 131. The semiconductor chip 124 is rigidly mounted on the ground plane. In this embodiment, the heat radiating characteristics can be improved and the package is not deformed or bent due to heat shrinkage, in the same manner as in the above embodiments.

Figure 9:
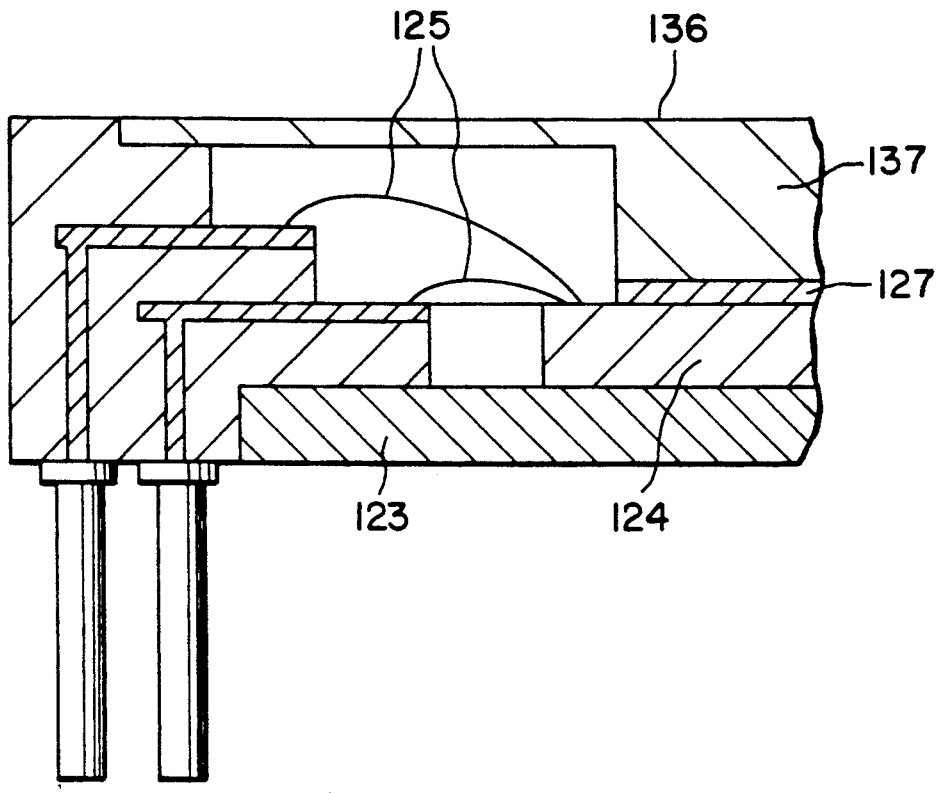
FIG. 9 is a partial cross-sectional view of an embodiment including a ceramic package.

This invention is also applicable to devices other than the resin sealing type semiconductor device as mentioned above. FIG. 9 is a partial cross-sectional view of an embodiment including a multi-layer ceramic package. In this embodiment, a semiconductor chip 124 is mounted on a heat sink 123 and a chip surface of the semiconductor chip 124 is attached via a chip coated layer 127 to a cover body 136, which also functions as a heat sink. In this embodiment, the lower surface of the cover body 136 is provided with a projected land 137 in contact with the chip surface.

In this embodiment, the heat derived from the chip surface of the semiconductor chip 124 can be discharged via the chip coated layer 127 to the housing 136 facing the outside, and therefore, the heat radiating characteristic can be improved. In general, a ceramic itself is porous, and therefore, the heat conductivity thereof is not good. According to this embodiment, however, such a heat conductivity of the ceramic package can be improved. Note, in this embodiment, the lower heat sink may be omitted.

Figure 10:
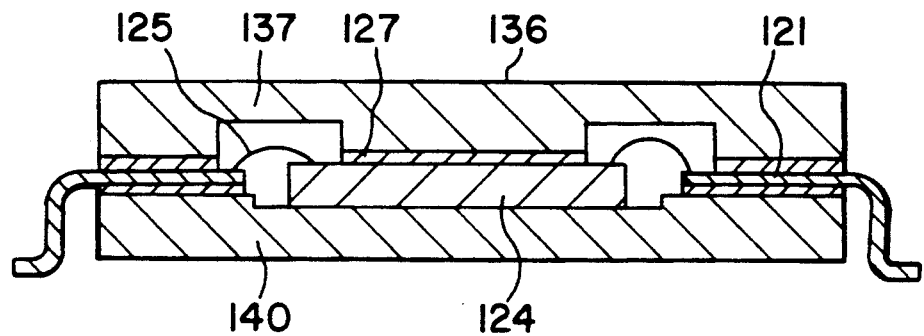
FIG. 10 is a cross-sectional view of an embodiment including a ceramic quad type or metal quad type package.

FIG. 10 shows an embodiment of a semiconductor device including a ceramic quad type or metal quad type package. In this embodiment, a semiconductor chip 124 is rigidly mounted on a ceramic or metal base 140 having a periphery provided with inner leads 121 of the lead frame 120 attached to the base by a low-melting point glass or resin inner leads. The semiconductor chip 224 is connected to the inner leads 121 by bonding wires 125. A cover 136 made of ceramic or metal is attached to the periphery of the base 140 so as to cover the semiconductor chip 124 and hold the inner leads 121 via a low-melting point glass or resin.

In this embodiment, the cover 136 is provided at the inside thereof with a projected land 137 attached to the chip surface of the semiconductor chip 124 via the chip coated layer 127. In this case, the cover 136 also functions as a heat sink.

In this embodiment, the heat radiated from the chip surface of the semiconductor chip 124 can be discharged via the chip coated layer 127 and the projected land 137 to the cover 136 facing the outside, and therefore, the heat radiating characteristics can be improved.

Figure 11:
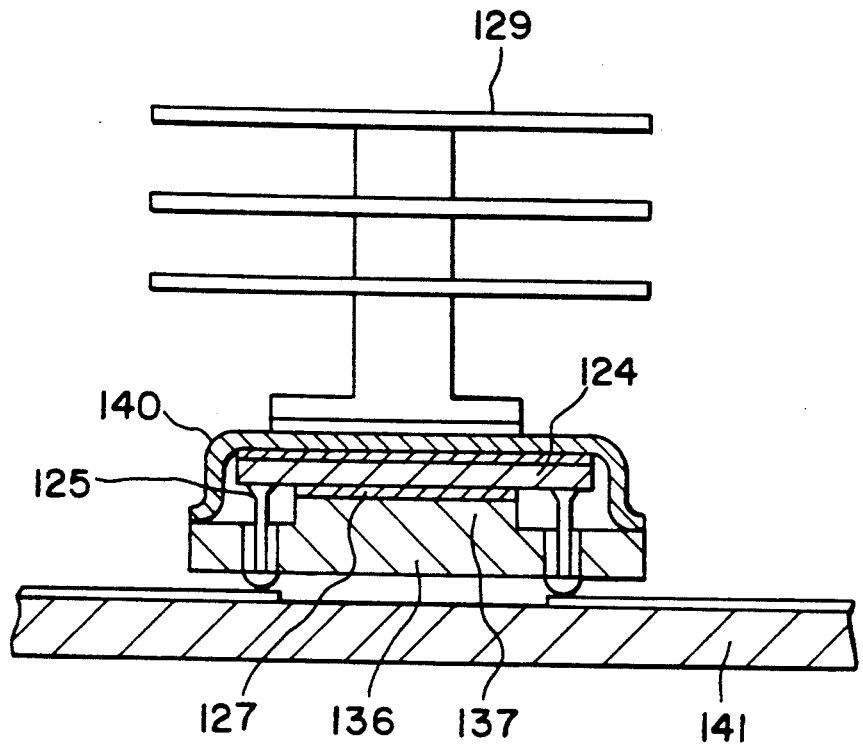
FIGS. 11 and 12 are cross-sectional views of respective embodiments including radiating fins.

FIG. 11 is a cross-sectional view of a further embodiment of a semiconductor device. In this embodiment, a semiconductor chip 124 is rigidly mounted on a cap-shaped base 140 by an adhesive. The chip surface of the semiconductor chip 124, on which a junction pattern exists, is attached to a projected land 137 of a cover 136, which also functions as a heat sink, via a chip coated layer 127. The periphery of the base 140 is rigidly secured to the periphery of the cover 136, to airtightly enclose the semiconductor chip 124. The semiconductor chip 124 has terminals connected to metal wires 125 by wire bonding. The other ends of the wires 125 pass through holes provided in the cover 136 and are introduced to the outside of the cover 136 on which terminals are formed by bumps. Preferably, a heat radiating fin 129 is attached to the outside of the base 140.

Also, preferably the cover 136 is made of a heat conductive material, such as AlN or the like, which has a coefficient of thermal expansion similar to that of silicon. Reference numeral 141 designates a circuit substrate.

Figure 12:
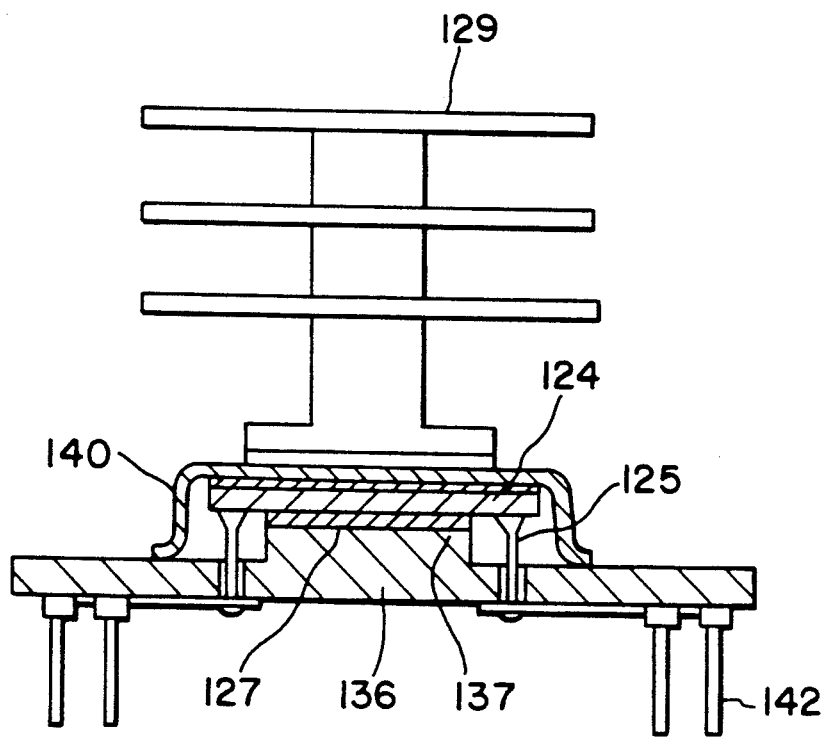

FIG. 12 is a cross-sectional view of an embodiment applied to a PGA type semiconductor device. In this embodiment, the cover 136 as illustrated in FIG. 11 is formed with a circuit pattern connected to the semiconductor chip 124 by wires 125. External connecting pins 142 are connected to the circuit pattern.

In the embodiments of a semiconductor device shown in FIGS. 11 and 12, the heat derived from the chip surface of the semiconductor chip 124, on which a junction pattern exits, can be directly discharged via the projected land 137 to the cover 136 facing the outside, and therefore, the heat radiating characteristic can be improved.

Figure 13:
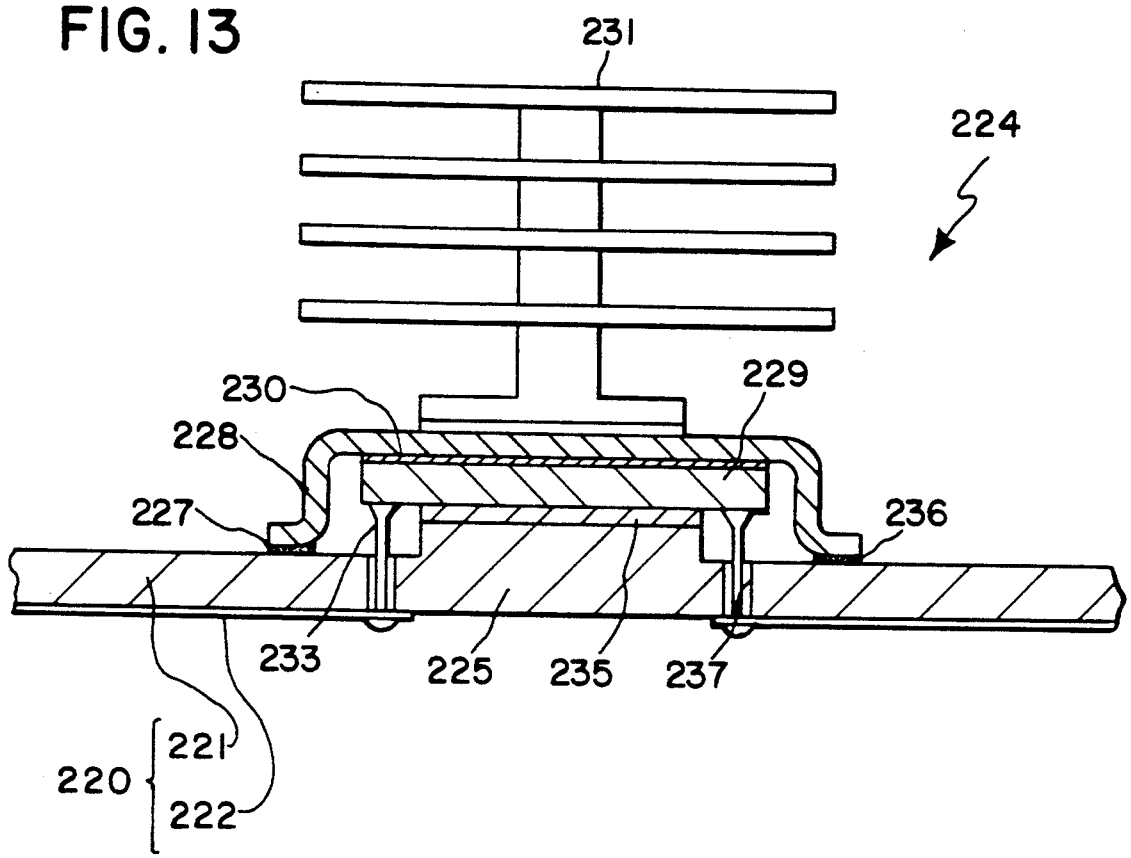
FIGS. 13 and 14 are cross-sectional views of still other embodiments of a semiconductor device.
Figure 14:
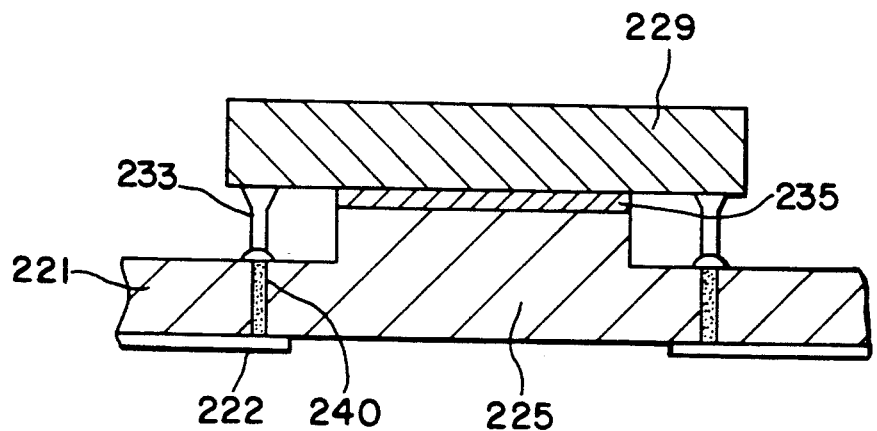

FIGS. 13 and 14 are cross-sectional views of still other embodiments of a semiconductor device.

In FIG. 13, the reference numeral 220 designates a circuit board comprising a ceramic substrate made of a heat conductive material, such as AlN or the like, and a circuit pattern formed on the substrate. In the illustrated embodiment, such a circuit pattern 222 is formed on the back surface of the ceramic substrate 221.

The front surface of the ceramic substrate 221, on which a semiconductor device 224 is mounted, is integrally provided with a projected land 225 having a predetermined height.

As shown in FIG. 13, the semiconductor device 224 is rigidly secured via an adhesive 230 to a cap 228 made of any suitable metal or the like and having a generally U-shaped cross-section provided with a peripheral flange portion 227 at the open end thereof. A heat radiating fin 231 is mounted on the outer side of the cap 228.

The semiconductor chip 229 has terminals connected to metal wires 233 by wire bonding. The semiconductor device 224 is rigidly mounted on the projected land 225 via an insulative adhesion 235, so that the chip surface of the semiconductor chip 229, on which a junction pattern exists, is attached to the projected land 225. The cap 228 is rigidly mounted by the peripheral flange portion 227 on the ceramic substrate 221, by a suitable solder 236. The wires 233 pass through holes 237 provided in the ceramic substrate 221 and are introduced to the outside of the ceramic substrate 221 to be connected to terminals of the circuit pattern 222 thereon by a solder.

In this embodiment constructed as mentioned above, the heat derived from the chip surface, from which a large amount of heat is emitted, can be effectively discharged via the projected land 225 to the ceramic substrate 221, which has a relatively large thermal capacity. On the other hand, the heat derived from the back surface of the semiconductor chip 229 also can be effectively discharged via the cap 228 and the heat radiating fin 231.

Therefore, it is particularly advantageous that this embodiment be applied to a mount of semiconductor device which comprises a high power semiconductor chip, from which a large amount of heat is emitted.

The ceramic substrate 221 can be made of suitable material, such as AlN or the like, which has a coefficient of thermal expansion similar to that of the semiconductor chip made of silicone, and thus a thermal balance with respect to the semiconductor chip 229 can be attained and a thermal stress at the semiconductor chip 229 also can be reduced. Particularly, according to this embodiment, as the projected land 225 is independently projected upward from the ceramic substrate 221, thermal stress is released by the projected land 225, and therefore, a concentration of thermal stress can be effectively prevented, compared with a device, for example, a chip-on-board type semiconductor device, in which a semiconductor chip is directly mounted on a circuit board.

Also, external connecting wires 233 of the semiconductor chip 229 are connected to the ceramic substrate 221, and thus a direct electrical connection between the semiconductor chip 229 and the circuit pattern of the substrate 221 can be attained. Therefore, an mounting area or space can be reduced, compared with a Galwing type semiconductor device, and therefore, a highly sophisticated semiconductor device can be obtained.

FIG. 14 shows another embodiment of semiconductor device, in which the ceramic substrate 221 is provided with terminals connected to the circuit patterns 222 by via 240.

Although the circuit pattern 222 is formed on the back surface of the ceramic substrate 221 in this embodiment, such a circuit pattern 222 can be formed on the front surface thereof, on which a semiconductor device 240 is mounted (not illustrated).

It should be understood by those skilled in the art that the foregoing description relates to only a preferred embodiment of the disclosed invention, and that various changes and modifications may be made to the invention without departing from the spirit and scope thereof.

We claim:

1. A semiconductor device comprising:
   a lead frame comprising,
   a first heat sink having a peripheral area and a central projected land, said first heat sink having a relatively good heat radiating characteristic, and
   a plurality of inner leads, each having an inner end superimposed on said peripheral area of the first heat sink by an electrically insulating material; a semiconductor chip having a chip surface on which a junction pattern is arranged, said semiconductor chip mounted on said central projected land of the first heat sink by an electrically insulating adhesive so that said chip surface faces said projected land; TAB leads for electrically connecting said junction pattern of said semiconductor chip to said inner leads; and
   a sealing resin hermetically sealing semiconductor chip, said first heat sink, said TAB leads and said inner leads.

2. A semiconductor device as set forth in claim 1, wherein said heat sink is made of a material selected from the group consisting of Mo, AlN, SiC, Cu-W, Cu and Al having a coefficient of thermal expansion similar to that of said semiconductor chip.

3. A semiconductor device as set forth in claim 1, wherein said semiconductor chip has a second surface opposite to said chip surface, and said semiconductor device further comprises: a second heat sink having a relatively good heat radiating characteristic, said second heat sink being attached to said second surface of the semiconductor chip by an electrically insulating or electrically conductive adhesive.

4. A semiconductor device as set forth in claim 3, wherein said first and second heat sinks are made of the same material and selected from the group consisting of Mo, AlN, SiC, Cu-W, Cu and Al.

* * * * *